United States Patent
Gheorghiu

(10) Patent No.: US 7,184,480 B1
(45) Date of Patent: Feb. 27, 2007

(54) DIGITAL PWM GENERATOR

(75) Inventor: Virgil Gheorghiu, Campbell, CA (US)

(73) Assignee: O2Micro International Limited, Grand Cayman (KY)

( * ) Notice: Subject to any disclaimer, the term of this patent is extended or adjusted under 35 U.S.C. 154(b) by 758 days.

(21) Appl. No.: 10/254,429

(22) Filed: Sep. 25, 2002

(51) Int. Cl.
*H03K 7/08* (2006.01)

(52) U.S. Cl. .................. 375/238; 375/239; 375/242; 375/353; 370/212

(58) Field of Classification Search ............... 375/237, 375/238, 239, 242, 353; 370/212; 327/172, 327/175, 184, 100; 341/126, 142, 144, 147
See application file for complete search history.

(56) References Cited

U.S. PATENT DOCUMENTS

| | | | | |
|---|---|---|---|---|
| 4,017,744 A | * | 4/1977 | Johnson | 327/172 |
| 4,327,588 A | * | 5/1982 | North | 73/599 |
| 4,329,717 A | * | 5/1982 | Logie et al. | 358/446 |
| 4,523,267 A | * | 6/1985 | Mehl | 363/87 |
| 4,536,748 A | * | 8/1985 | Tonello | 340/506 |
| 4,775,902 A | * | 10/1988 | Trovato et al. | 360/78.13 |
| 4,890,332 A | * | 12/1989 | Takahashi | 455/67.13 |
| 5,006,933 A | * | 4/1991 | Suzuki et al. | 348/791 |
| 5,107,831 A | * | 4/1992 | Halpern et al. | 128/204.26 |
| 5,481,214 A | * | 1/1996 | Tamaki et al. | 327/172 |
| 6,246,222 B1 | * | 6/2001 | Nilles et al. | 323/283 |
| 2006/0049889 A1 | * | 3/2006 | Hooley | 332/109 |
| 2006/0091872 A1 | * | 5/2006 | Matsuura | 323/283 |

* cited by examiner

*Primary Examiner*—Pankaj Kumar
*Assistant Examiner*—Naheed Ejaz
(74) *Attorney, Agent, or Firm*—Grossman, Tucker, Perreault & Pfleger PLLC

(57) ABSTRACT

A digital PWM circuit is provided. One exemplary circuit includes a binary counter, an n-bit DAC and a comparator. The binary counter generates a plurality of binary signals in increasing and/or decreasing value. The DAC circuit generates ramp signals composed of a plurality of DC signals based on the binary signals. In another exemplary embodiment, reset circuitry is provided to control the frequency of the ramp signals.

7 Claims, 4 Drawing Sheets

DIGITAL PWM GENERATOR

FIELD OF THE INVENTION

The present invention relates to circuits and methods for generating a pulse width modulated (PWM) signal. More particularly, the present invention relates to a digital PWM signal generator. The present invention has general utility in a wide range of applications, for example, power electronics including DC/DC converters, DC/AC inverters, and any application that utilizes PWM signals.

SUMMARY OF THE INVENTION

In one exemplary embodiment, the present invention provides a digital PWM signal circuit that includes a binary counter, a DAC circuit and a comparator. The binary counter is configured to receive a clock signal and generate a plurality of binary signals. The DAC circuit is configured to receive the plurality of binary signals and generate a plurality of ramp signals. The comparator is configured to receive the ramp signals and generate a PWM signal.

In another exemplary embodiment, the digital PWM signal circuit includes a binary counter, a DAC circuit, a comparator and reset circuitry. The binary counter is configured to receive a clock signal and generate a plurality of binary signals. The DAC circuit is configured to receive the plurality of binary signals and generate a plurality of ramp signals. The comparator is configured to receive the ramp signals and generate a PWM signal. The reset circuitry is configured receive said ramp signals and configured to reset the binary counter to control the frequency of the plurality of the ramp signals.

It will be appreciated by those skilled in the art that although the following Detailed Description will proceed with reference being made to preferred embodiments and methods of use, the present invention is not intended to be limited to these preferred embodiments and methods of use. Rather, the present invention is of broad scope and is intended to be limited as only set forth in the accompanying claims.

Other features and advantages of the present invention will become apparent as the following Detailed Description proceeds, and upon reference to the Drawings, wherein like numerals depict like parts, and wherein:

DETAILED DESCRIPTION OF EXEMPLARY EMBODIMENTS

Figure 1:
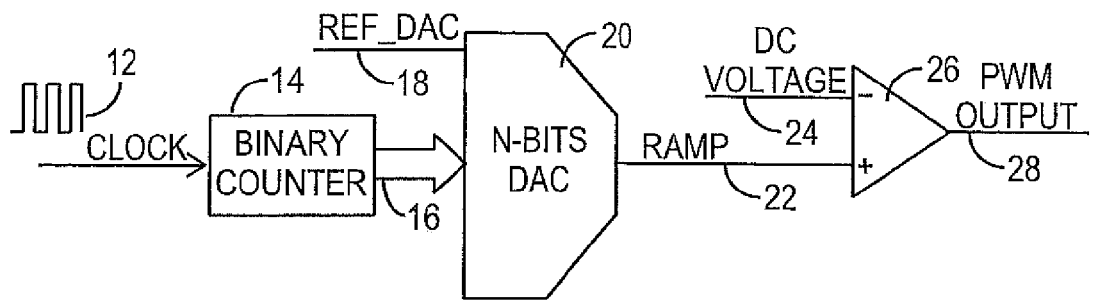
FIG. 1 is a block diagram of an exemplary digital PWM generator according to one exemplary embodiment of the present invention.

FIG. 1 is a block diagram of an exemplary digital PWM generator 10 according to one exemplary embodiment of the present invention. This embodiment includes a binary counter 14, a DAC 20 and a comparator 26. The binary counter 14 of this embodiment is an n-bit counter that can be preprogrammed to count up or down. The counter 14 receives a clock signal 12, and generates n digital outputs 16. The number of outputs n may correspond to the number of DAC bits, but in general may be any number for a desired resolution. In this embodiment, on every pulse of the clock signal 12 the output of the binary counter 14 is incremented or decremented. However, it is equally contemplated herein that the output of the binary counter may be based on the clock signal such that, for example, every other pulse or every third pulse increments or decrements the output.

Figure 1A:
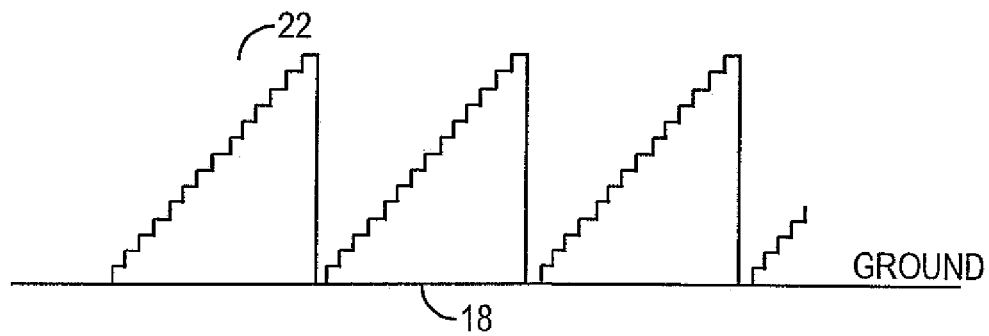

The DAC 20 is a digital to analog converter circuit that generates a plurality of DC level signals as a function of REF_DAC voltage 18 and the combination of binary inputs 16 generated by the binary counter 14. The DC level outputs are incremented up or down to form a "staircase" of signals having an overall ramp shape. If the input generated by the binary counter 14 increases in binary code (count UP) the DAC 20 will generate at the output a "RAMP-UP" staircase 22, as depicted in FIG. 1a. In FIG. 1a, the ramp signal is generated with respect to a ground reference signal 18, however, the ramp signal may be generated with respect to any reference.

Figure 1B:
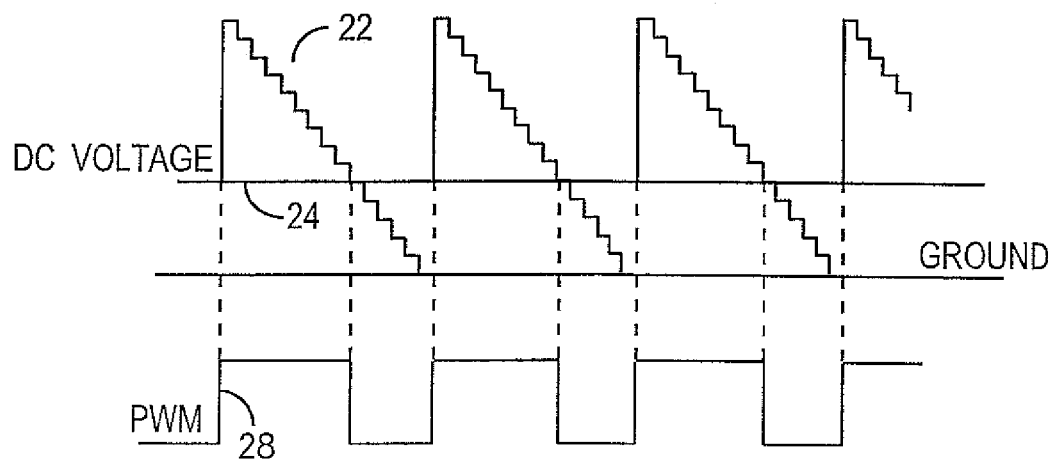

The binary counter 14 and the DAC 20 generate periodic staircase waves. The numbers of steps are equal with $2^n$. The $2^n$ steps staircase can be generate UP or DOWN, between zero volt (ground) and LSB×$2^n$, where n=numbers of bits. In this exemplary embodiment, the ramp generator is a "free running" ramp generator, where the period of staircase waves is equal to: PERIOD=$T_{CLOCK} \times 2^n$ The ramp signals 22 may be used to generate a PWM signal. A comparator 26 may be provided to generate PWM signals as a function of DC voltage 24 applied on an inverting input (−) of the comparator 24, and the amplitude and period of ramp signal 22. This is illustrating in FIG. 1b, using a RAMP DOWN ramp signal 22. As is understood in the art, the duty cycle of the PWM signal 28 generated by the comparator 26 is determined by the intersection of the DC signal 24 and the ramp signal 22. Those skilled in the art will also recognize that the DAC circuit may be modified with one (or more) capacitors to "smooth" the ramp signal. Or, the circuitry can be implemented to generate quasi saw tooth waves, without using capacitor(s).

Figure 2:
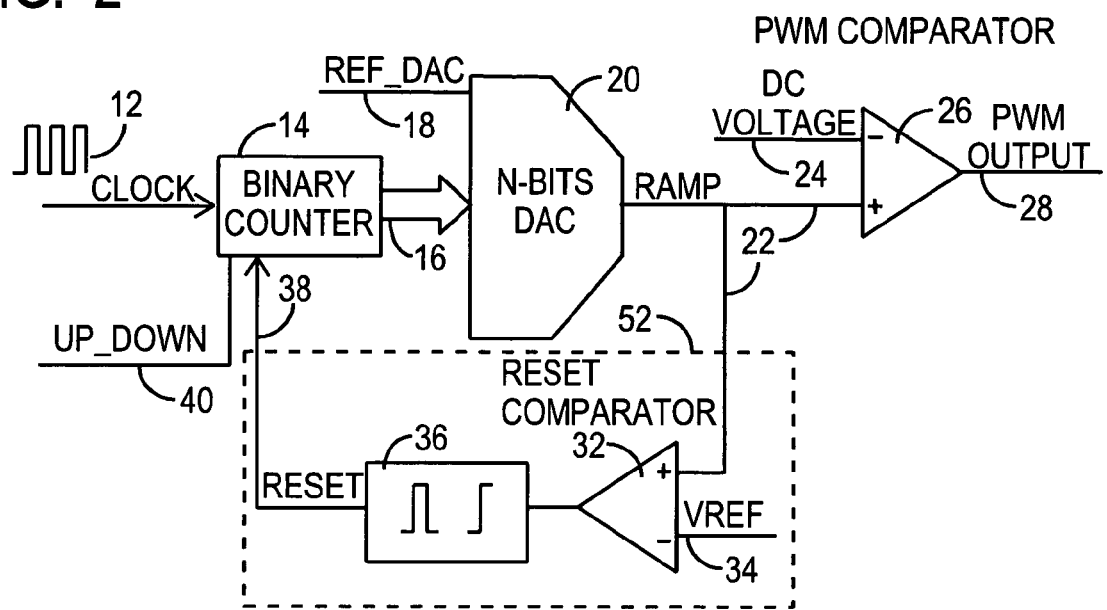
FIG. 2 is a block diagram of another exemplary digital PWM generator according to the present invention.

FIG. 2 is a block diagram of another exemplary digital PWM generator 30 according to the present invention. The operation of the DAC 20 and comparator 26 to generate their respective signals are discussed above with reference to FIGS. 1, 1a and 1b. In this exemplary embodiment, the frequency of the ramp signals is controlled by a reset circuitry 52 that includes a reset comparator 32 and pulse shaper 36. In this exemplary embodiment, the binary counter 14 may include an up-down input 40 and a reset input 38. The up-down input 40 is a command signal that commands the binary counter 14 to generate RAMP DOWN signals (decreasing binary count) and/or RAMP UP signals (increasing binary count).

Figure 2A:
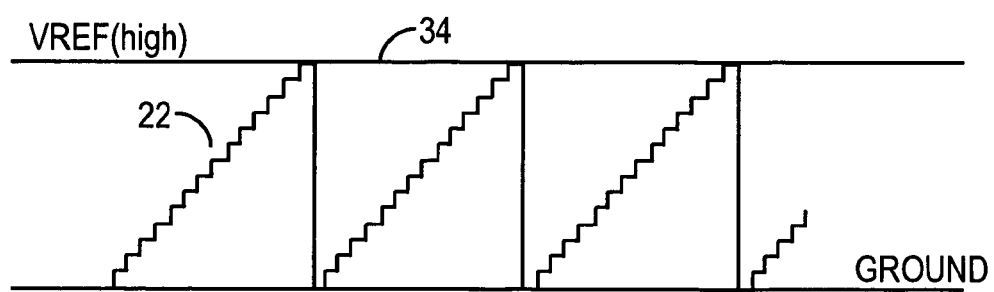
Figure 2B:
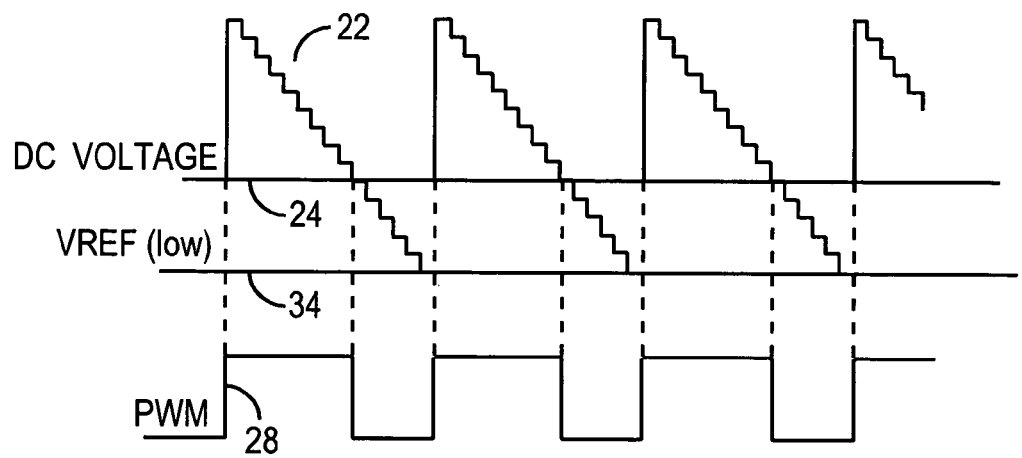

In general, the frequency of staircase generator can be controlled by a DC voltage, "VREF" 34, as shown in FIG. 2. A reset comparator 32 compares the ramp signal 22 with a VREF voltage 34, and generates the output a negative slope signal (e.g., transitional signal) when VREF is greater than the ramp signal. A pulse shaper 36 receives the negative slope signal generated by the comparator and generates the reset pulse signal 38. The binary counter 14' receives the reset pulse and resets the binary count to the initial value. In the exemplary embodiment, when the ramp signal 22 meets VREF voltage 34, the reset comparator 32 resets the binary counter. Accordingly, the output of DAC goes to the initial value. For example, as depicted in FIG. 2b, when the ramp signal 22 is a RAMP DOWN signal, the value of VREF is selected as low reference voltage (VREF=LOW). The block diagram of FIG. 2 can be modified to generate a RAMP UP signal as depicted in FIG. 2a. For this modification, the ramp signal 22 is connected to the inverting (−) input of the comparator and VREF 34 is connected to the noninverting (+) input. When the ramp signal is a RAMP UP signal, the value of VREF is selected as greater than the ground voltage (VREF=HIGH). In a similar manner as described above, a comparator 26 may be used to generate a PWM signal, as also depicted in FIG. 2b.

Figure 2C:
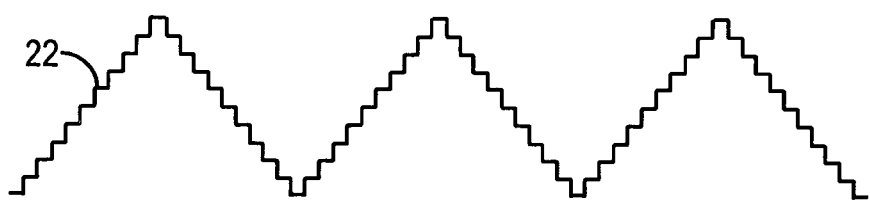

Of course, the binary counter 14 can be adapted to generate RAMP UP and RAMP DOWN signals in an alternating fashion, as depicted in FIG. 2c. In this case the reset comparator 32 and pulse shaper may be omitted, and instead the up-down signal 40 may be used to trigger the binary counter to generate the RAMP UP/RAMP DOWN signal, as shown.

Figure 3:
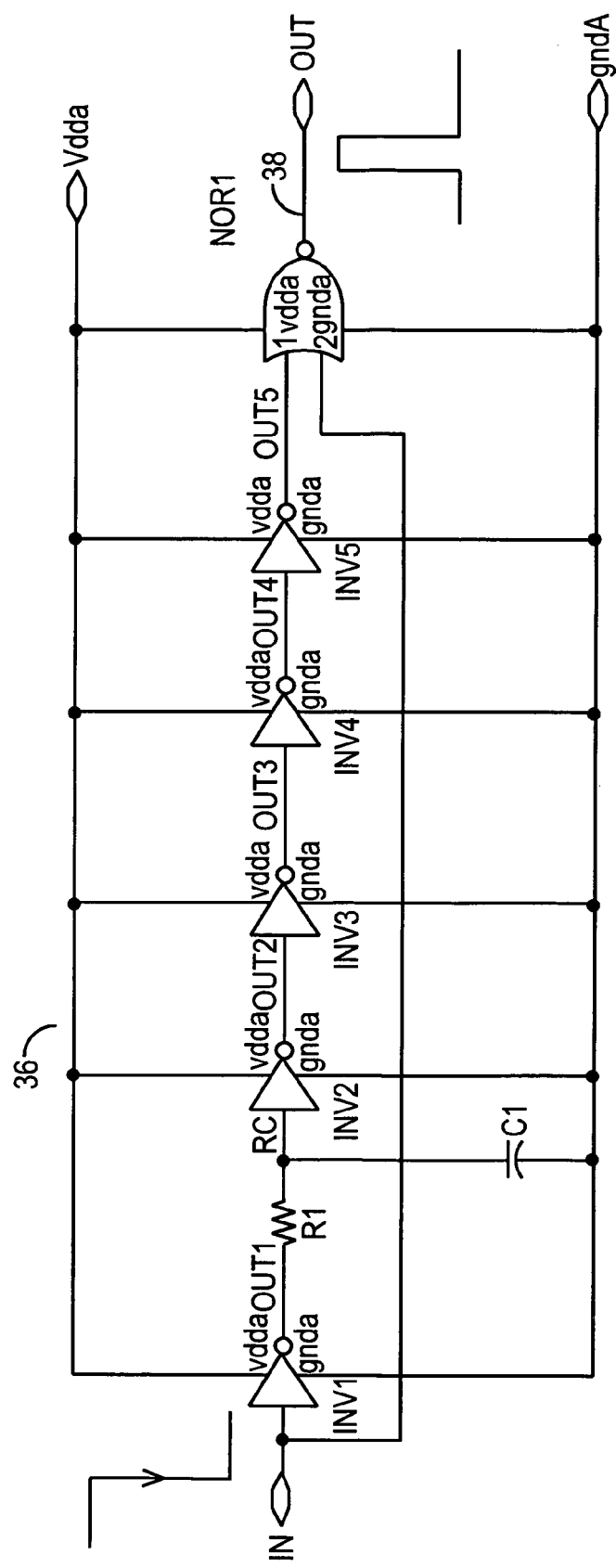
FIG. 3 depicts an exemplary detailed circuit diagram of the pulse shaper according to the present invention.

FIG. 3 depicts one exemplary detailed circuit diagram of the pulse shaper 36. The pulse shaper includes a plurality of inverters (INV1, INV2, . . . , INV5) coupled in series to the output of the comparator 32. The output of the inverters are coupled to an input (input 1) of a NOR gate NOR1. The output of the comparator is also coupled to another input (input 2) of the NOR gate NOR1. A time delay circuit is provided in the series of inverters, represented by an RC circuit. The circuit operates as follows. If the input is HIGH, the high signal is applied directly to NOR1, at input 2, and accordingly the output of the NOR gate 38 is LOW. If the input is LOW, the signal applied to the NOR input 1 is HIGH and the output of the NOR gate is LOW. If the input falls from HIGH to LOW (transition), the input into the NOR input 2 falls in the same time as the input, but input 1 is still low until the RC voltage rises and triggers INV2. Consequently the NOR gate output is HIGH and will change the status after the input signal propagates through the inverters and the RC circuit.

Those skilled in the art will recognize that the individual components that are represented in the block diagrams of FIGS. 1 and 2 may be implemented by one skilled in the art in numerous ways, using numerous circuit topologies. All such implementations are deemed equivalents to the present invention. The pulse shaper depicted in FIG. 3 is a conventional circuit topology. Other pulse shaping topologies known in the art may be substituted without departing from the present invention. Numerous modifications will become apparent to those skilled in the art, and all such modifications are deemed within the spirit and scope of the present invention, only as limited by the appended claims.

The invention claimed is:

1. A digital pulse width modulated (PWM) circuit, comprising:
    a binary counter configured to receive a clock signal and generate a plurality of binary signals;
    a digital to analog converter (DAC) circuit configured to receive said plurality of binary signals and generate a plurality of ramp signals;
    a PWM comparator configured to compare said ramp signals and a DC signal and generate a PWM signal having a duty cycle based on the intersection of said ramp signals and said DC signal; and
    reset circuitry comprising a reset comparator configured to compare said ramp signals with a reference signal and generate an output signal, and a pulse shaper configured to receive said output signal from said comparator and generate a reset signal based on the comparison between said ramp signal and said reference signal;
    said reset circuitry is configured to reset said binary counter, using said reset signal, to control the frequency of said plurality of ramp signals and to control the duty cycle of said PWM signal.

2. A digital PWM signal circuit as claimed in claim 1; wherein said binary counter configured to increment the value of said binary signals based on said clock signal.

3. A digital PWM signal circuit as claimed in claim 1 wherein said binary counter configured to decrement the value of said binary signals based on said clock signal.

4. A digital PWM signal circuit as claimed in claim 1, wherein said DAC circuit is configured to generate a plurality of DC level signals as a function of a reference voltage and the combination of said binary signals generated by said binary counter.

5. A digital PWM signal circuit as claimed in claim 1, wherein said binary counter further configured to generate a ramp signal that ramps up.

6. A digital PWM signal circuit as claimed in claim 1, wherein said binary counter further configured to generate a ramp signal that ramps down.

7. A digital PWM signal circuit as claimed in claim 1, wherein said binary counter further configured to generate a ramp signal that ramps up and down.

* * * * *